US010111342B2

(12) United States Patent
Tsuruta et al.

(10) Patent No.: US 10,111,342 B2
(45) Date of Patent: Oct. 23, 2018

(54) SOLDER TRANSFER SHEET, SOLDER BUMP, AND SOLDER PRECOATING METHOD USING SOLDER TRANSFER SHEET

(71) Applicants: Senju Metal Industry Co., Ltd., Tokyo (JP); NITTA CORPORATION, Osaka-shi (JP)

(72) Inventors: Kaichi Tsuruta, Tochigi (JP); Takeo Saitoh, Tochigi (JP); Manabu Muraoka, Tochigi (JP); Hiroki Oshima, High Wycombe (GB); Koji Yamashita, Nara (JP); Shinichiro Kawahara, Nara (JP)

(73) Assignees: Senju Metal Industry Co., Ltd., Tokyo (JP); Nitta Corporation, Osaka (JP)

( * ) Notice: Subject to any disclaimer, the term of this patent is extended or adjusted under 35 U.S.C. 154(b) by 0 days.

(21) Appl. No.: 15/539,341

(22) PCT Filed: Dec. 21, 2015

(86) PCT No.: PCT/JP2015/085731
§ 371 (c)(1),
(2) Date: Jun. 23, 2017

(87) PCT Pub. No.: WO2016/104459
PCT Pub. Date: Jun. 30, 2016

(65) Prior Publication Data
US 2017/0354042 A1 Dec. 7, 2017

(30) Foreign Application Priority Data
Dec. 26, 2014 (JP) ................................ 2014-265348

(51) Int. Cl.
*H05K 3/34* (2006.01)
*H01L 23/492* (2006.01)
(Continued)

(52) U.S. Cl.
CPC ....... *H05K 3/3457* (2013.01); *H01L 23/4928* (2013.01); *H05K 3/321* (2013.01);
(Continued)

(58) Field of Classification Search
None
See application file for complete search history.

(56) References Cited

U.S. PATENT DOCUMENTS 5,376,403 A * 12/1994 Capote ................. B22F 3/1035
148/24
6,333,561 B1 12/2001 Chen
(Continued)

FOREIGN PATENT DOCUMENTS

JP 2003347343 A 12/2003
JP 200834756 A 2/2008
(Continued)

OTHER PUBLICATIONS

TIPO Examination Report /Office Action for application TW 104143516, dated Sep. 5, 2017.

*Primary Examiner* — Joseph Schoenholtz
(74) *Attorney, Agent, or Firm* — The Webb Law Firm

(57) ABSTRACT

Provided is a solder transfer sheet which is capable of increasing the amount of solder to be transferred without the occurrence of bridging. A solder transfer sheet 1A includes a base material 5, an adhesive layer 4 formed on the surface of the base material 5, a solder powder-containing adhesive layer 3 formed on the surface of the adhesive layer 4, and a solder powder layer 2 formed on the surface of the solder powder-containing adhesive layer 3. In the solder powder layer 2, particles of solder powder 20 are arranged in a one-layer sheet form. In the solder powder-containing adhesive layer 3, solder powder 30 and an adhesive component 31 are mixed so as to have such a thickness that two or more layers of the solder powder 30 are stacked.

8 Claims, 4 Drawing Sheets

(51) Int. Cl.
  *H01L 21/60* (2006.01)
  *C09J 201/02* (2006.01)
  *C09J 11/04* (2006.01)
  *H05K 3/32* (2006.01)
  *C09J 7/02* (2006.01)

(52) U.S. Cl.
  CPC ............. *H05K 3/34* (2013.01); *H05K 3/341* (2013.01); *H05K 3/3478* (2013.01); *C09J 7/0203* (2013.01); *C09J 11/04* (2013.01); *C09J 201/02* (2013.01); *H01L 2021/60015* (2013.01)

(56) References Cited

U.S. PATENT DOCUMENTS

| | | | |
|---|---|---|---|
| 8,701,973 B2 | 4/2014 | Kuramoto et al. | |
| 9,238,278 B2* | 1/2016 | Sakurai | B23K 1/0016 |
| 2008/0003804 A1 | 1/2008 | Nalla et al. | |
| 2008/0213613 A1 | 9/2008 | Kuramoto et al. | |
| 2009/0023245 A1* | 1/2009 | Kitae | H05K 3/3436 438/108 |
| 2010/0059872 A1* | 3/2010 | Katsurayama | C09J 7/0203 257/686 |
| 2011/0297433 A1* | 12/2011 | Kuramoto | B23K 1/0016 174/263 |
| 2013/0181041 A1* | 7/2013 | Sakurai | B23K 1/0016 228/245 |
| 2014/0217595 A1* | 8/2014 | Sakurai | B23K 35/262 257/772 |

FOREIGN PATENT DOCUMENTS

| | | |
|---|---|---|
| JP | 201445078 A | 3/2014 |
| JP | 2014138019 A | 7/2014 |
| WO | 2006043377 A1 | 4/2006 |
| WO | 2006067827 A1 | 6/2006 |
| WO | 2010093031 A1 | 8/2010 |

* cited by examiner

SOLDER TRANSFER SHEET, SOLDER BUMP, AND SOLDER PRECOATING METHOD USING SOLDER TRANSFER SHEET

CROSS-REFERENCE TO RELATED APPLICATIONS

This application is the United States national phase of International Application No. PCT/JP2015/085731 filed Dec. 21, 2015, and claims priority to Japanese Patent Application No. 2014-265348 filed Dec. 26, 2014, the disclosures of which are hereby incorporated in their entirety by reference.

TECHNICAL FIELD

The present invention relates to a solder transfer sheet for transferring solder which forms solder bumps onto target portions where the solder bumps are to be formed, solder bumps formed using the solder transfer sheet, and a solder precoating method using the solder transfer sheet.

BACKGROUND

When, on a substrate such as a printed-circuit board, another substrate or an electronic part is mounted, the electrodes of the electronic part or the like are soldered to the electrodes of the substrate. In this case, a soldering method by a reflow method is simple in which solder bumps are previously formed on the electrodes of the substrate and the electrodes of the electronic part or the like are soldered to the solder bumps.

Formation of solder bumps is most commonly performed by printing a solder paste with the use of a mask and then melting solder by heating. However, when such a printing method is used, the yield decreases due to the occurrence of bridging or variations in the amount of solder as the number of electrodes on a substrate increases so that the electrodes become miniaturized and the electrode pitch becomes narrower, which inevitably increases production costs.

Some methods for forming solder bumps with the use of a solder transfer sheet have recently been proposed. Patent Document 1 proposes a transfer sheet in which recesses formed in a solder resist layer are filled with solder powder. The pattern of the recesses of the transfer sheet is the same as that of the electrodes of a substrate.

When this solder transfer sheet is placed so that the recesses thereof are opposed to the electrodes of a substrate, and is then heated under pressure to melt the solder powder, solder bumps are formed on the electrodes of the substrate. It is essential for this method to perform the alignment of the transfer sheet. Further, since the transfer sheet needs to have recesses formed in a predetermined pattern, the production costs of the transfer sheet are increased.

On the other hand, as disclosed in Patent Document 2, there is a method using a transfer sheet in which one layer of solder powder is adhered to the entire surface of a supporting substrate using an adhesive layer. This transfer sheet is placed so that the solder powder surface thereof is opposed to the electrodes of a substrate. The substrate except the areas of electrodes is previously coated with a solder resist. Then, the substrate on which the transfer sheet has been placed is heated under pressure to melt the solder powder so that the electrodes are wetted with molten solder and the solder is adhered to the electrodes, but the solder resist-coated portion is not wetted with the molten solder.

After the molten solder is solidified by cooling, the transfer sheet is then removed from the substrate so that the substrate can be obtained in which the solder bumps are formed on the electrodes thereof. The solder in the portion of the transfer sheet opposed to the solder resist-coated portion is solidified while remaining adhered to the transfer sheet. This transfer sheet has solder powder adhered to the entire surface thereof but has no recesses, and therefore can be easily produced at low costs. Further, this transfer sheet makes it possible to eliminate the need for alignment, which is a troublesome operation, when the transfer sheet is placed on a substrate.

Further, as disclosed in Patent Document 3, there is also a method for forming solder bumps, as a method for forming solder bumps having a fine pattern, in which unlike the solder powder is melted during the transfer in the method disclosed in Patent Document 2, solder powder of a solder transfer sheet is transferred onto electrodes by solid-phase diffusion bonding caused by heating under pressure at a temperature lower than the melting point of solder.

Further, as described in Patent Document 4, there is additionally a method using a solder transfer sheet having a solder layer containing a solder powder sintered body obtained by sintering two or more layers of solder powder by solid-phase diffusion bonding, as a method for forming solder bumps by solder transfer, in order to perform the transfer, when forming relatively high solder bumps in a fine pattern without causing problems such as transfer defects including solder bridging and electrode destruction, which is similar to a case where one layer of solder powder is used.

DOCUMENTS FOR PRIOR ART

Patent Documents

Patent Document 1: WO2006/043377 A1
Patent Document 2: WO2006/067827 A1
Patent Document 3: WO2010/093031 A1
Patent Document 4: Japanese Patent Application Publication No. 2014-045078 A1

SUMMARY OF THE INVENTION

Problems to be Solved by the Invention

The solder transfer sheets disclosed in Patent Documents 2 and 3 are excellent in that soldering in a fine pattern is possible without alignment, but have a problem that the amount of solder to be transferred onto electrodes cannot be increased because one layer of solder powder is formed on an adhesive layer. As disclosed in Patent Document 4, the amount of solder to be transferred may be increased by preparing a solder powder sintered body obtained by previously sintering two or more layers of solder powder by solid-phase diffusion bonding. However, in order to cause solid-phase diffusion bonding, solder powder needs to be heated under pressure while being maintained at a temperature equal to or lower than its solidus temperature.

In order to increase the amount of solder to be transferred onto electrodes to form relatively high solder bumps, it is conceivable that the particle diameter of solder powder may be increased. However, an increase in the particle diameter of solder powder in relation to miniaturized electrodes causes a problem that so-called bridging occurs in which molten solder connects adjacent electrodes together and is solidified as it is.

The present invention solves the above problems and has an object to provide a solder transfer sheet which is capable of increasing the amount of solder to be transferred without causing bridging, solder bumps formed using the solder transfer sheet, and a solder precoating method using the solder transfer sheet.

Means for Solving the Problems

The present inventors have found that transferability can be ensured and the amount of solder to be transferred can be increased without increasing the particle diameter of solder powder to be in direct contact with an electrode surface by mixing solder powder and an adhesive component to provide a layer including a plurality of layers of the solder powder.

Based on the finding, the present invention relates to a solder transfer sheet including: a base material; an adhesive layer formed on one surface of the base material; a solder powder-containing adhesive layer formed on one surface of the adhesive layer; and a solder powder layer formed on one surface of the solder powder-containing adhesive layer, wherein the solder powder layer contains solder powder arranged in a sheet form, and the solder powder-containing adhesive layer contains a mixture of solder powder and an adhesive component so as to have a predetermined amount of solder.

The present invention also relates to the solder transfer sheet in which the adhesive component of the solder powder-containing adhesive layer contains a side-chain crystalline polymer, the adhesive component having flowability at a temperature equal to or higher than a melting point of the side-chain crystalline polymer to exhibit adhesive force and the adhesive component being crystallized at a temperature lower than the melting point of the side-chain crystalline polymer to reduce the adhesive force thereof.

Further, the present invention relates to the solder transfer sheet in which the side-chain crystalline polymer has a melting point of 30° C. or higher but lower than 70° C.

Additionally, the present invention relates to the solder transfer sheet in which the adhesive component has adhesive force of less than 2.0 N/25 mm at a temperature lower than the melting point of the side-chain crystalline polymer.

The present invention further relates to a solder bump formed using the above-described solder transfer sheet.

The present invention additionally relates to a solder precoating method using a solder transfer sheet, the method including the steps of:

A: applying an adhesive onto a base material to form an adhesive layer;

B: forming a solder powder-containing adhesive layer containing solder powder and an adhesive on the adhesive layer;

C: spreading solder powder on the solder powder-containing adhesive layer;

D: removing an excess of the solder powder on the solder powder-containing adhesive layer to form a solder powder layer;

E: laying the solder powder layer of a solder transfer sheet having the adhesive layer, the solder powder-containing adhesive layer, and the solder powder layer on top of an electrode side of a workpiece;

F: applying heat and pressure at the same time on an object obtained by laying the solder transfer sheet on top of the workpiece; and G: removing the solder transfer sheet after solder solidification.

According to the present invention, the solder transfer sheet is attached to the electrodes of a substrate in such a manner that the solder powder layer is opposed to the electrodes thereof to be bonded. Then, the solder powder of the solder powder layer is diffusion-bonded to the electrodes by applying heat and pressure. It is to be noted that diffusion bonding includes both the cases where solder is bonded by melting and where solder is bonded by a solid-phase diffusion phenomenon at a temperature equal to or lower than the solidus temperature thereof.

Then, the base material is removed from the solder transfer sheet so that the base material and the adhesive layer are separated from the solder powder-containing adhesive layer in areas where the solder powder of the solder powder layer is diffusion-bonded to the electrodes and areas where the solder powder of the solder powder-containing adhesive layer is directly and indirectly diffusion-bonded to the solder powder of the solder powder layer. On the other hand, the solder powder layer and the solder powder-containing adhesive layer remain on the base material side in areas where the solder powder of the solder powder layer is not in contact with the electrodes and areas where the solder powder of the solder powder-containing adhesive layer is neither directly nor indirectly diffusion-bonded to the solder powder of the solder powder layer.

Then, the substrate having the electrodes, to which the solder layer and the solder powder-containing adhesive layer of the solder transfer sheet have been bonded, is put into a reflow furnace to perform soldering. As a result, the solder powder of the solder layer and the solder powder of the solder powder-containing adhesive layer are melted so that solder spreads and wets the electrodes to form solder bumps. As described above, the present invention is different from the invention disclosed in Patent Document 4, in which two or more layers of solder powder are stacked by solid-phase diffusion bonding, and is characterized in that a solder powder-containing adhesive layer having a predetermined amount of solder is provided by mixing solder powder and an adhesive component.

Effects of the Invention

According to the present invention, the solder powder-containing adhesive layer having a predetermined amount of solder is provided in addition to the solder powder layer provided as a uppermost layer in which the solder powder is arranged in one layer, which makes it possible to increase the amount of solder to be transferred to increase the height of resulting solder bumps without increasing the particle diameter of the solder powder of the solder powder layer. Further, it is possible to suppress the occurrence of bridging because it is not necessary to increase the particle diameter of the solder powder of the solder powder layer, the solder powder in the solder powder-containing adhesive layer is fixed by the adhesive, and misalignment of the solder powder is less likely to occur during transfer, for example.

Further, according to the present invention, the solder powder in the solder powder layer is not mixed with an adhesive component, and therefore directly comes into contact with electrodes and is reliably diffusion-bonded to the electrodes by adjusting temperature and pressure. Further, the force by which particles of the solder powder in the solder powder-containing adhesive layer are connected together with the adhesive component is weaker than the force by which the solder powder of the solder powder-containing adhesive layer is directly and indirectly diffusion-bonded to the solder powder of the solder powder layer, and therefore the solder powder of the solder powder-containing adhesive layer is separated at the interfaces between areas where the solder powder of the solder powder-containing adhesive layer is directly and indirectly diffusion-bonded to the solder powder of the solder powder layer and areas where the solder powder of the solder powder-containing adhesive layer is neither directly nor indirectly diffusion-bonded to the solder powder of the solder powder layer so that the solder powder is transferred to the electrode side from the base material side. This makes it possible to increase the height of resulting solder bumps while suppressing the occurrence of defects such as solder bridges. Further, when the temperature of heating performed on the electrode side during transfer is set to be higher than that performed on the base material side during transfer, the amount of the solder powder of the solder powder-containing adhesive layer that is directly and indirectly diffusion-bonded to the solder powder of the solder powder-containing adhesive layer and the solder powder of the solder powder layer is increased, which makes it possible to increase the amount of the solder powder of the solder powder-containing adhesive layer to be transferred to the electrode side from the base material side.

EMBODIMENT FOR CARRYING OUT THE INVENTION

The following will describe an embodiment of a solder transfer sheet according to the present invention with reference to the drawings.

<Configuration Example of Solder Transfer Sheet According to Embodiment of the Present Invention>

Figure 1:
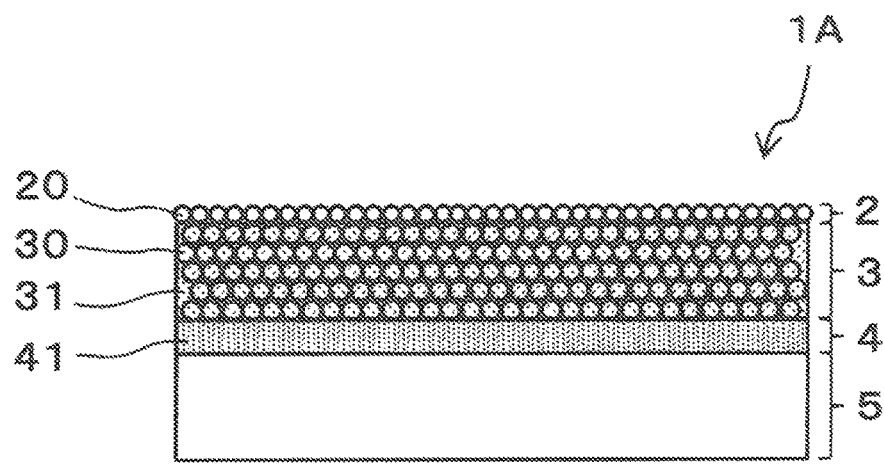
FIG. 1 is a configuration diagram showing one example of a solder transfer sheet according to this embodiment.

FIG. 1 is a configuration diagram showing one example of a solder transfer sheet according to this embodiment. A solder transfer sheet 1A according to this embodiment includes a solder powder layer 2, a solder powder-containing adhesive layer 3, an adhesive layer 4, and a base material 5.

In the solder transfer sheet 1A, the adhesive layer 4 is formed on a surface of the base material 5 which is one surface thereof, and the solder powder-containing adhesive layer 3 is formed on a surface of the adhesive layer 4 which is one surface thereof. Further, the solder powder layer 2 is formed on a surface of the solder powder-containing adhesive layer 3 which is one surface thereof.

The solder powder-containing adhesive layer 3 is adhered to the base material 5 by the adhesiveness of an adhesive component 41 constituting the adhesive layer 4. In the solder powder-containing adhesive layer 3, solder powder 30 and an adhesive component 31 are mixed so as to contain a predetermined amount of solder. In the solder powder-containing adhesive layer 3, particles of the solder powder 30, which are not in contact with the adhesive layer 4, are connected together by the adhesive component 31.

In the solder powder layer 2, solder powder 20 is adhered to the solder powder-containing adhesive layer 3 by the adhesiveness of the adhesive component 31 of the solder powder-containing adhesive layer 3.

The adhesive component 31 of the solder powder-containing adhesive layer 3 preferably contains a side-chain crystalline polymer so that the adhesive component 31 exhibits its adhesive force by having flowability at a temperature equal to or higher than a melting point of the side-chain crystalline polymer and that the adhesive force thereof is reduced by crystallization thereof at a temperature lower than the melting point of the side-chain crystalline polymer. More specifically, it is preferable to use the adhesive component having adhesive force of less than 2.0 N/25 mm at a temperature lower than the melting point of the side-chain crystalline polymer. Here, the melting point of the side-chain crystalline polymer means a temperature at which a specific part of the polymer initially arranged to have an ordered array is turned into a disordered state by a certain equilibrium process, and refers to a value obtained by measurement using a differential scanning calorimeter (DSC) under a measurement condition of 10° C./min.

As the side-chain crystalline polymer contained in the adhesive component 31, the one having a melting point of 30° C. or higher but lower than 70° C. is used. Therefore, from the viewpoint of enhancing adhesiveness, the step of forming the solder powder layer 2 containing the solder powder 20 on the solder powder-containing adhesive layer 3 containing the solder powder 30 and the adhesive component 31 is performed while the base material 5 is heated to about 30 to 70° C.

This is because the side-chain crystalline polymer is melted in the step of forming the solder powder layer 2 so that the adhesive component 31 easily exhibits its adhesiveness. Further, as described above, the step of forming the solder powder layer 2 is performed while the base material 5 is heated to about 30 to 70° C., but it is cooled to about 10° C. after the step of forming the solder powder layer 2. At the time of such cooling, the side chains of the side-chain crystalline polymer are crystallized, which makes it possible to more firmly hold the solder powder layer 2 formed on the solder powder-containing adhesive layer 3.

The adhesive component 41 of the adhesive layer 4 is not particularly limited as long as its close adhesion (stickiness) to the solder powder-containing adhesive layer 3 is not impaired and its storage elastic modulus during transfer of the transfer sheet is $1 \times 10^6$ Pa or less.

In consideration of the close adhesion, it is preferable to use, as the adhesive component 41, the same adhesive component as that used in the solder powder-containing adhesive layer 3.

Further, from the viewpoint of removability from a substrate (hereinafter, referred to as "workpiece") and adhesiveness between the solder powder-containing adhesive layer 3 and the adhesive layer 4, it is preferable to adjust the adhesive component 31 so that the storage elastic modulus of the adhesive component 31 used in the solder powder-containing adhesive layer 3 is higher than that of the adhesive component 41 of the adhesive layer 4.

The side-chain crystalline polymer contained in the adhesive component 41 having the melting point of 30° C. or higher but lower than 70° C. is used. Therefore, from the viewpoint of enhancing adhesiveness, the step of forming the solder powder-containing adhesive layer 3 containing the solder powder 30 and the adhesive component 31 on the adhesive layer 4 is also performed while the base material 5 is heated to about 30 to 70° C.

This is because the side-chain crystalline polymer is melted in the step of forming the solder powder-containing adhesive layer 3 so that the adhesive component 41 easily exhibits its adhesiveness. Further, as described above, the step of forming the solder powder-containing adhesive layer 3 is performed while the base material is heated to about 30 to 70° C., but it is cooled to about 10° C. after the step of forming the solder powder-containing adhesive layer 3. At the time of such cooling, the side chains of the side-chain crystalline polymer are crystallized, which makes it possible to more firmly hold the solder powder-containing adhesive layer 3 formed on the adhesive layer 4.

As the side-chain crystalline polymer satisfying the above characteristics, for example, acrylic ester copolymers are exemplified. As the acrylic ester copolymers, polymer obtained by polymerizing 30 to 90 wt % of the acrylic ester or methacrylic ester having a linear alkyl group of 16 or more carbon atoms, 10 to 70 wt % of the acrylic ester or methacrylic ester having an alkyl group of 1 to 6 carbon atoms, and 1 to 10 wt % of a polar monomer is exemplified.

The acrylic ester copolymer functions also as flux for removing a metal oxide film during transfer to electrodes. The acrylic ester copolymer has a boiling point higher than the melting points of the solder powder 30 of the solder powder-containing adhesive layer 3 and the solder powder 20 of the solder powder layer 2, and is therefore not volatilized at a temperature at which the solder powder 30 and the solder powder 20 are melted.

It is to be noted that the adhesive component 31 of the solder powder-containing adhesive layer 3 and the adhesive component 41 of the adhesive layer 4 preferably contain a cross-linking agent. As the cross-linking agent, for example, an isocyanate-based compound, an aziridine-based compound, an epoxy-based compound, a metal chelate-based compound and the like are exemplified. They may be used singly or in combination of two or more of them.

The solder powder 20 of the solder powder layer 2 is made of a solder alloy mainly containing Sn. The solder powder 20 used in this embodiment is made of Sn-2.5 Ag (Ag: 2.5 wt %, Sn: remainder). Similarly to the solder powder layer 2, the solder powder 30 of the solder powder-containing adhesive layer 3 used in this embodiment is also made of Sn-2.5 Ag.

The solder powder 20 of the solder powder layer 2 and the solder powder 30 of the solder powder-containing adhesive layer 3 may have the same composition or different compositions. Further, the solder powder 20 and the solder powder 30 may have the same particle diameter but they may satisfy the relationship such that the particle diameter of the solder powder 20 is equal to or smaller than that of the solder powder 30 (particle diameter of solder powder 20 particle diameter of solder powder 30). The reason for this is as follows. When the particle diameter of the solder powder 20 is increased to increase the amount of solder to be transferred, as described above, solder bridging is likely to occur. However, since the solder powder 30 contained in the solder powder-containing adhesive layer 3 is fixed by an adhesive, misalignment of the solder powder 30 is less likely to occur during transfer etc. even when the particle diameter of the solder powder 30 is increased, and therefore the height of resulting solder bumps can be increased while the occurrence of bridging is suppressed. It is to be noted that the composition of the solder powder is not limited to the above example as long as the solder powder is made of a solder alloy containing Sn, Ag, Cu, Pb, Zn, Bi, In, or Sb as a main ingredient. Further, at least one element, other than an element as the main ingredient, selected from Sn, Ag, Cu, Pb, Zn, Bi, In, Sb, Ge, Ga, Co, Ni, Fe, Au, and Cr may be added.

As the base material 5, a synthetic resin such as polyethylene terephthalate, polyethylene, polypropylene, polyester, polyamide, polyimide, polycarbonate, ethylene-vinyl acetate copolymers, ethylene-ethyl acrylate copolymers, ethylene-polypropylene copolymers, and polyvinyl chloride is used. The base material 5 may have either a single layer structure or a multi-layered structure. Usually, the base material 5 preferably has a thickness of 5 μm or more but 500 μm or less. Further, the base material may be subjected to surface treatment such as corona discharge treatment, plasma treatment, blasting treatment, chemical etching treatment, or primer treatment to enhance its close adhesion to the adhesive layer.

In the solder transfer sheet 1A according to this embodiment, the particle diameters of the solder powder 20 and the solder powder 30 are set to, for example, 4 μm. The thickness of the solder powder-containing adhesive layer 3 is set to 15 μm. The volume ratio between the solder powder 30 and the adhesive component 31 in the solder powder-containing adhesive layer 3 is set to 74:26 (solder powder 30: adhesive component 31) so that the solder powder-containing adhesive layer 3 is formed in a state where particles of the solder powder 30 are in closest contact with one another.

<Example of Method for Producing Solder Transfer Sheet According to this Embodiment>

Figure 2A:
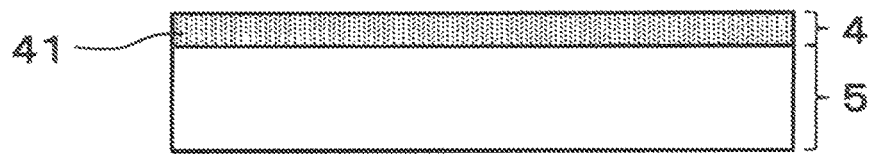
FIG. 2A is an explanatory diagram showing one example of a method for producing the solder transfer sheet according to this embodiment.
Figure 2B:
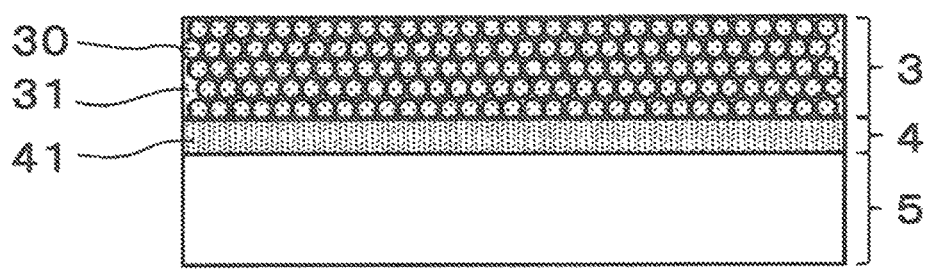
FIG. 2B is an explanatory diagram showing one example of the method for producing the solder transfer sheet according to this embodiment.
Figure 2C:
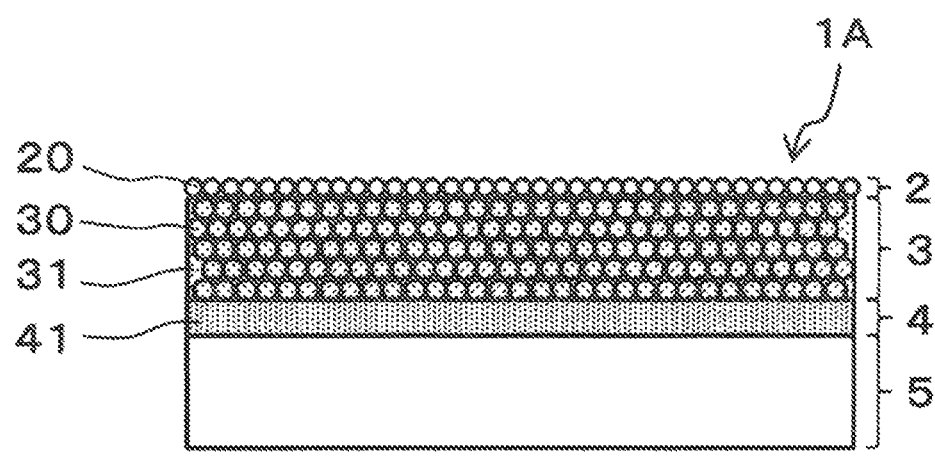
FIG. 2C is an explanatory diagram showing one example of the method for producing the solder transfer sheet according to this embodiment.

FIGS. 2A, 2B, and 2C are explanatory diagrams showing one example of a method for producing the solder transfer sheet according to this embodiment.

(a) Method for Forming Adhesive Layer 4

In order to provide the adhesive layer 4 on at least a one surface of the base material 5, a solution prepared by adding a solvent to the adhesive component 41 that constitutes the adhesive layer 4 is applied onto at least the one surface of the base material 5 with a coater or the like and dried. As a result, as shown in FIG. 2A, the adhesive layer 4 having a predetermined thickness is formed on the surface of the base material 5. This adhesive layer 4 plays not only the role of adhering the solder powder-containing adhesive layer 3, which will be described later, but also the role of a cushion in the step of applying pressure during transfer of the transfer sheet.

(b) Method for Forming Solder Powder-Containing Adhesive Layer 3

A solution prepared by adding a solvent to the adhesive component 31 that constitutes the solder powder-containing adhesive layer 3, which is the same as the adhesive component 41 that constitutes the adhesive layer 4 in this embodiment, and further adding the solder powder 30 is applied onto one surface of another base material (not shown) with a coater or the like and dried. It is to be noted that the base material used for forming the solder powder-containing adhesive layer 3 is removed from the solder powder-containing adhesive layer 3 in a later step, and therefore may be subjected to surface treatment before the application of the solution so as to be easily removed.

The solutions prepared to form the above-described solder powder-containing adhesive layer 3 and adhesive layer 4 may contain various additives such as a cross-linking agent, a tackifier, a plasticizer, an antioxidant, and an ultraviolet absorber.

As the coater used to apply the solution, for example, a knife coater, a roll coater, a calender coater, a comma coater, a gravure coater, a rod coater and the like are exemplified.

(c) Method for Adhering Solder Powder-Containing Adhesive Layer 3 and Adhesive Layer 4 Together The adhesive layer 4 formed on the base material 5 and the solder powder-containing adhesive layer 3 formed on another base material (not shown) are adhered together by attaching them together at a predetermined temperature.

In the step of adhering the solder powder-containing adhesive layer 3 and the adhesive layer 4 together, for example, the base material 5 having the adhesive layer 4 formed thereon is placed on a hot plate set to a predetermined temperature that is equal to or higher than the melting points of the adhesive component 41 of the adhesive layer 4 and the adhesive component 31 of the solder powder-containing adhesive layer 3 so that adhesiveness can be enhanced. In a state where the adhesive layer 4 is heated through the base material 5, the another base material (not shown) having the solder powder-containing adhesive layer 3 formed thereon is placed with the adhesive layer 4 and the solder powder-containing adhesive layer 3 being opposed to each other. In this way, the solder powder-containing adhesive layer 3 and the adhesive layer 4 are adhered together.

Then, the base material 5 having the solder powder-containing adhesive layer 3 and the adhesive layer 4 adhered together is removed from the hot plate and then, cooled. After the cooling, another base material (not shown) is removed. As a result, as shown in FIG. 2B, the solder powder-containing adhesive layer 3 in which the adhesive component 31 and the solder powder 30 are mixed so that two or more layers of the solder powder 30 are stacked is formed on the surface of the adhesive layer 4 formed on the base material 5.

The thickness of the adhesive layer 4 is preferably 5 µm or more but 60 µm or less, more preferably 5 µm or more but 50 µm or less, even more preferably 5 µm or more but 40 µm or less. Further, the thickness of the solder powder-containing adhesive layer 3 is preferably 5 µm or more but 60 µm or less, more preferably 5 µm or more but 40 µm or less, even more preferably 10 µm or more but 30 µm or less.

(d) Method for Forming Solder Powder Layer 2

In the solder powder layer 2, the solder powder 20 is adhered to the surface of the solder powder-containing adhesive layer 3 formed on the base material 5 through the adhesive layer 4 so that the layer(s) having one or more layers of the solder powder 20 is (are) formed.

In the step of adhering the solder powder 20, for example, the base material 5 having the adhesive layer 4 and the solder powder-containing adhesive layer 3 formed thereon is placed on a hot plate set to a predetermined temperature that is equal to or higher than the melting point of the adhesive component 31 of the solder powder-containing adhesive layer 3 so that adhesiveness can be enhanced.

In a state where the adhesive layer 4 and the solder powder-containing adhesive layer 3 are heated through the base material 5, the solder powder 20 is sprinkled onto the surface of the solder powder-containing adhesive layer 3 and uniformly dispersed using an electrostatic brush and a puff so that the solder powder 20 is adhered to the surface of the solder powder-containing adhesive layer 3 and an excess of the powder is removed.

Then, the base material 5 having the solder powder 20 adhered to the solder powder-containing adhesive layer 3 is removed from the hot plate and then cooled. As a result, as shown in FIG. 2C, the solder powder layer 2 having one or more layers of the solder powder 20 is formed on the surface of the solder powder-containing adhesive layer 3 formed on the base material 5 through the adhesive layer 4. It is to be noted that the solder powder layer 2 may be a continuous solder alloy film.

<Example of Usage of Solder Transfer Sheet According to this Embodiment>

Figure 3A:
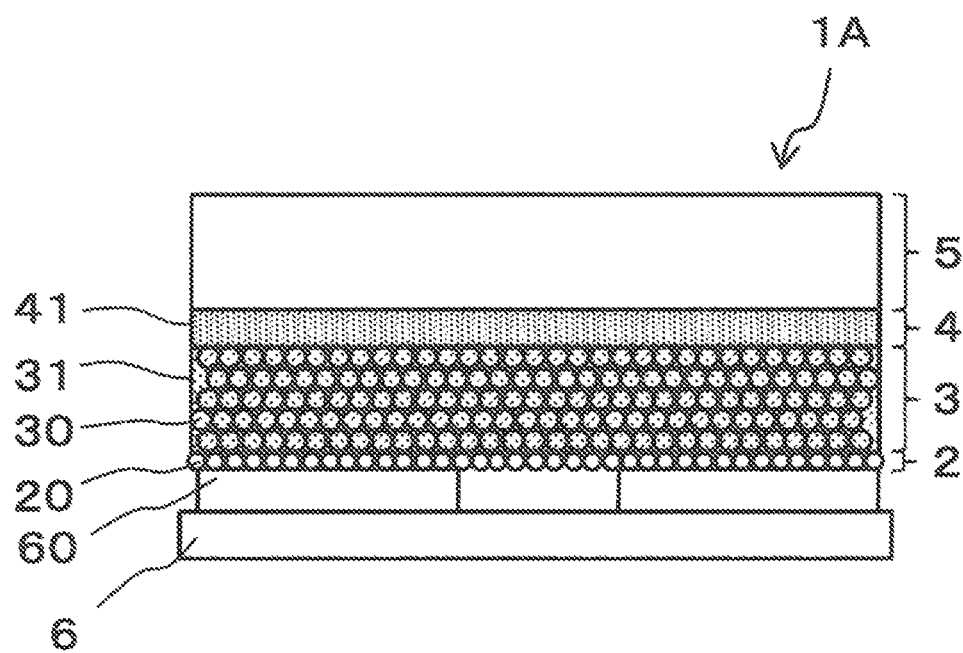
FIG. 3A is an explanatory diagram showing an example of the usage of the solder transfer sheet according to this embodiment.
Figure 3B:
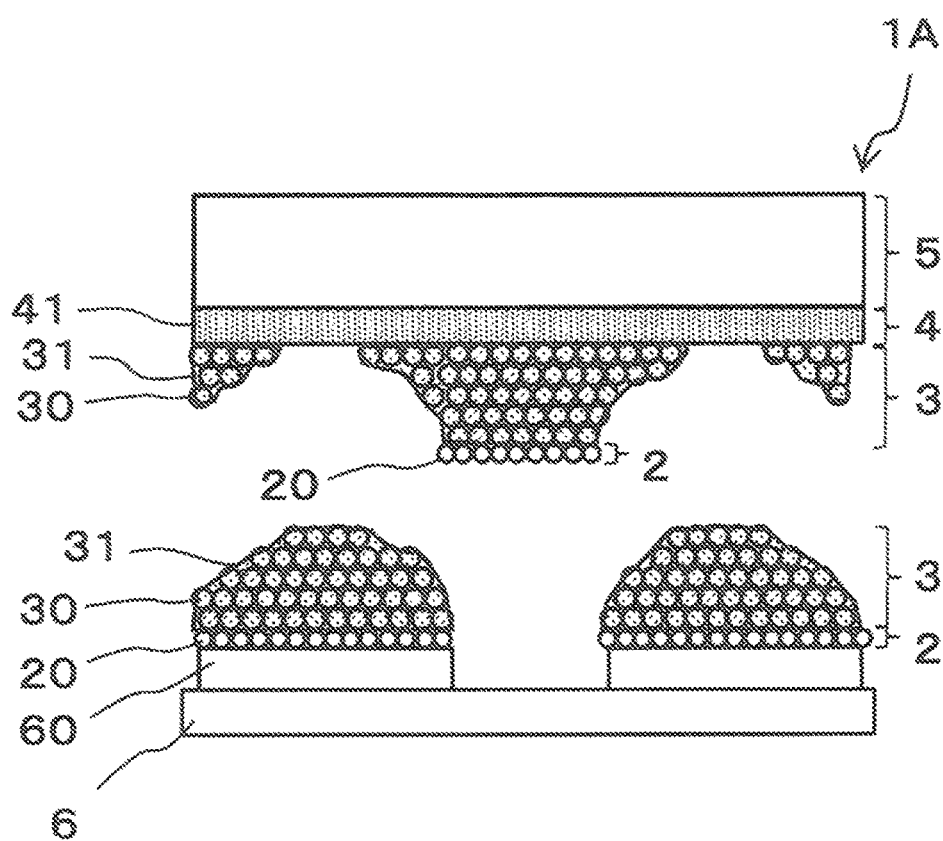
FIG. 3B is an explanatory diagram showing the example of the usage of the solder transfer sheet according to this embodiment.

FIGS. 3A and 3B are explanatory diagrams each showing an example of the usage of the solder transfer sheet according to this embodiment. First, as shown in FIG. 3A, the solder transfer sheet 1A is attached to electrodes 60 formed on a substrate 6 with the solder powder layer 2 being opposed to the electrodes 60 of the substrate 6. Then, when being heated under pressure, the solder powder 20 of the solder powder layer 2 is diffusion-bonded to the electrodes 60. As the electrodes 60, for example, cylindrical electrodes made of Cu, called Cu pillars, are used.

Then, as shown in FIG. 3B, the base material 5 is removed from the solder transfer sheet 1A attached to the electrodes 60 of the substrate 6. When the base material 5 is removed from the solder transfer sheet 1A, the base material 5 and the adhesive layer 4 are separated from the solder powder-containing adhesive layer 3 in areas where the solder powder 20 of the solder powder layer 2 is diffusion-bonded to the electrodes 60 and areas where the solder powder 30 of the solder powder-containing adhesive layer 3 is directly and indirectly diffusion-bonded to the solder powder 20 of the solder powder layer 2. On the other hand, the solder powder layer 2 and the solder powder-containing adhesive layer 3 remain on a side of the base material 5 in areas where the solder powder 20 of the solder powder layer 2 is not in contact with the electrodes 60 and areas where the solder powder 30 of the solder powder-containing adhesive layer 3 is neither directly nor indirectly diffusion-bonded to the solder powder 20 of the solder powder layer 2. That is, the solder powder-containing adhesive layer 3 is separated at interfaces between areas where the solder powder 30 of the solder powder-containing adhesive layer 3 is directly and indirectly diffusion-bonded to the solder powder 20 of the solder powder layer 2 and areas where the solder powder 30 of the solder powder-containing adhesive layer 3 is neither directly nor indirectly diffusion-bonded to the solder powder 20 of the solder powder layer 2.

In the solder powder layer 2, the solder powder 20 is not mixed with an adhesive component. Therefore, the solder powder 20 is in direct contact with the electrodes 60. Therefore, the solder powder 20 and the electrodes 60 are reliably diffusion-bonded together by adjusting temperature and pressure. The solder of the solder powder-containing adhesive layer 3 that is in contact with the solder of the solder powder layer 2 diffusion-bonded to the electrodes 60 is diffusion-bonded. On the other hand, particles of the solder powder 30 contained in the solder powder-containing adhesive layer 3 are connected together by the adhesive component 31, but the force by which particles of the solder powder 30 are connected together by the adhesive component 31 is weaker than the force by which the solder powder 30 is further directly and indirectly diffusion-bonded to the solder powder 20 diffusion-bonded to the electrodes 60, and therefore areas where diffusion bonding has occurred and areas where diffusion bonding has not occurred are separated from each other in the solder powder-containing adhesive layer 3.

This enables the solder powder layer 2 and the solder powder-containing adhesive layer 3 to prevent remaining on the side of the base material 5 in areas where the solder powder 20 of the solder powder layer 2 has been diffusion-bonded to the electrodes 60 and it is possible to selectively transfer the solder powder 20 and the solder powder 30 onto only the electrodes 60. Therefore, it is capable of coping with narrow-pitch micro electrodes by reducing the particle diameter of the solder powder.

Figure 4:
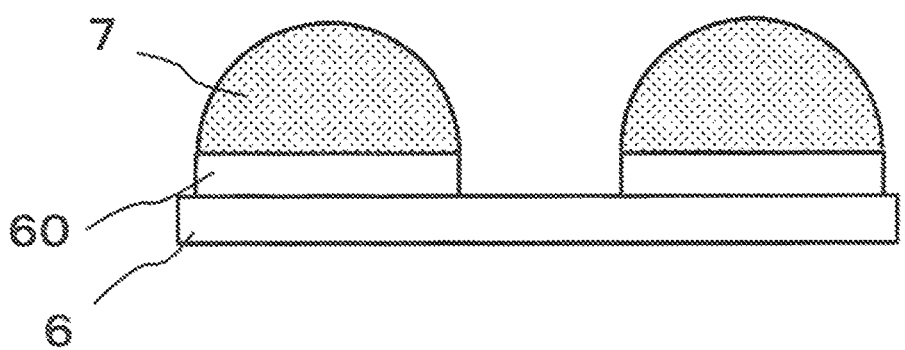
FIG. 4 is an explanatory diagram showing one example of solder bumps formed using the solder transfer sheet according to this embodiment.

FIG. 4 is an explanatory diagram showing one example of solder bumps formed using the solder transfer sheet according to this embodiment. Next, flux is applied onto the substrate 6 having the electrodes 60 to which the solder powder layer 2 and the solder powder-containing adhesive layer 3 of the solder transfer sheet 1A have been bonded, and then the substrate 6 is put into a reflow furnace to perform soldering. When the solder powder layer 2 and the solder powder-containing adhesive layer 3 are heated during reflowing, the solder powder 20 and the solder powder 30 are melted so that solder powder spreads and wets the electrodes 60 of the substrate 6. As a result, as shown in FIG. 4, solder bumps 7 are formed. Then, the adhesive component 31 as a residue is washed with an alkaline wash liquid.

The volatilization of the adhesive component 31 is suppressed at a temperature at which the solder powder 20 and the solder powder 30 are melted, which makes it possible to suppress generation of voids caused by air bubbles remaining in the solder bumps 7.

When a substrate has narrow-pitch micro electrodes, the particle size of solder powder needs to be reduced. The solder transfer sheet 1A according to this embodiment has the solder powder-containing adhesive layer 3 in addition to the solder powder layer 2, which makes it possible to increase the height of the solder bumps 7 without increasing the particle diameter of the solder powder 20. This allows suppressing the occurrence of any bridge.

In the present invention, the shape of particles of the solder powder 30 of the solder powder-containing adhesive layer 3 is not particularly limited, and may be spherical or granular. Further, the solder powder-containing adhesive layer 3 may be formed in such a manner that two or more layers of the solder powder 30 are stacked or one layer (sheet) of the solder powder 30 having a large particle diameter is provided.

Further, in the solder powder layer 2 of the present invention, the solder powder 20 may be formed to have two or more layers that are stacked by bonding the solder powder 20 using solid-phase diffusion or the like.

A workpiece, such as a substrate, to which solder has been transferred, is produced by a precoating method including the following steps, using the solder transfer sheet 1A according to this embodiment.

A: applying the adhesive component 41 onto the surface of the base material 5 to form the adhesive layer 4;

B: forming the solder powder-containing adhesive layer 3 containing solder powder 30 and the adhesive component 31 on the surface of the adhesive layer 4;

C: sprinkling solder powder 20 onto the surface of the solder powder-containing adhesive layer 3;

D: removing an excess of the solder powder 20 sprinkled onto the surface of the solder powder-containing adhesive layer 3 to form a solder powder layer 2;

E: laying the solder powder layer 2 of a solder transfer sheet 1A including the adhesive layer 4, the solder powder-containing adhesive layer 3, and the solder powder layer 2 on top of an electrode side of a workpiece;

F: applying heat and pressure at the same time on an object obtained by laying the solder transfer sheet 1A on top of the workpiece; and G: removing the solder transfer sheet 1A after solder solidification.

Executed Example

Figure 5A:
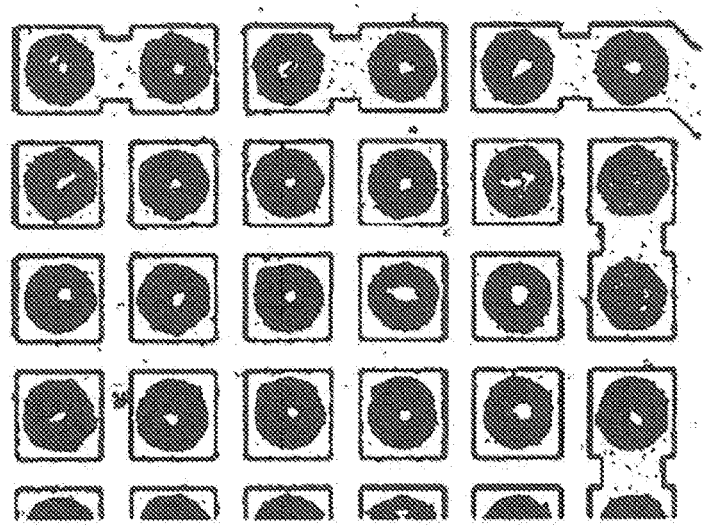
FIG. 5A is an explanatory diagram showing shapes of solder bumps formed using a solder transfer sheet of an executed example.
Figure 5B:
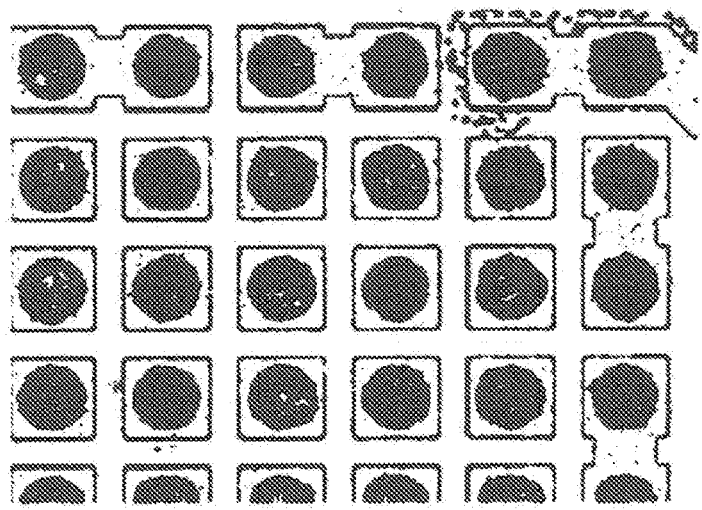
FIG. 5B is an explanatory diagram showing shapes of solder bumps formed using a solder transfer sheet of a comparison example.

A solder transfer sheet of executed example having, in addition to a solder powder layer in which particles of solder powder were arranged in one layer, a solder powder-containing adhesive layer in which two or more layers of solder powder were stacked, and a solder transfer sheet of comparison example having only a solder powder layer in which particles of solder powder were arranged in one layer, which were prepared in the following manner, were used to compare the transferability of solder powder and the shape of solder bumps after reflowing. FIG. 5A and FIG. 5B are explanatory diagrams each showing the shape of solder bumps of the executed example and the comparison example.

In both of the executed example and the comparison example, the compositions of the solder powder used in the solder transfer sheet were set to be Sn-2.5 Ag. The pitch between electrodes was set to be 50 µm. The size of a substrate was set to be 20×20 mm.

A side-chain crystalline polymer, which was used as the adhesive component of the adhesive layer and the adhesive component of the solder powder-containing adhesive layer in the executed example and was used as the adhesive component of the adhesive layer in the comparison example, was prepared in the following manner.

(1) Preparation of Side-Chain Crystalline Polymer

Synthesis Example

Behenyl acrylate was used as an acrylic ester or methacrylic ester having a linear alkyl group containing 16 carbon atoms or more, methyl acrylate was used as an acrylic ester or methacrylic ester having an alkyl group containing 1 to 6 carbon atoms, and acrylic acid was used as a polar monomer. It is to be noted that in the following description, "part(s)" refers to part(s) by mass.

First, 35 parts of behenyl acrylate, 60 parts of methyl acrylate, 5 parts of acrylic acid, and 0.3 parts of PERBUTYL ND (manufactured by NOF CORPORATION) were added to and mixed with 230 parts of ethyl acetate, and then they were stirred at 55° C. for 4 hours to polymerize these monomers. The thus obtained polymer had a weight-average molecular weight of 680,000, a melting point of 50° C., and a freezing point of 35° C.

(2) Production of Solder Transfer Sheet

Executed Example (1-a) Formation of Adhesive Layer

A solvent (ethyl acetate) was added to the polymer solution obtained in the above synthesis example to adjust the solid content % to 25%. Then, CHEMITITE PZ-33 (manufactured by NIPPON SHOKUBAI CO., LTD.) was added as a cross-linking agent to this polymer solution in an amount of 0.2 parts per 100 parts of the polymer. As a base material, a 100 μm-thick polyethylene terephthalate (PET) film was prepared. The above solution was applied onto a corona-treated surface of the film with a comma coater to obtain a 40 μm-thick adhesive layer containing an acrylic adhesive component.

(1-b) Formation of Solder Powder-Containing Adhesive Layer

A solvent (ethyl acetate) was added to the polymer solution obtained in the above synthesis example to adjust the solid content % to 25%. Then, CHEMITITE PZ-33 (manufactured by NIPPON SHOKUBAI CO., LTD.) was added as a cross-linking agent to this polymer solution in an amount of 0.2 parts per 100 parts of the polymer, and further solder powder was added so that the volume ratio between the solder powder and the polymer was solder powder: polymer=74:26. A 50 μm-thick polyethylene terephthalate (PET) film was subjected to silicone treatment to improve removability. The above solution mixed with solder powder was applied to a silicone-treated surface of the film with a comma coater to obtain a 15 μm-thick solder powder-containing adhesive layer containing solder powder and an acrylic adhesive component.

(1-c) Adhering Solder Powder-Containing Adhesive Layer and Adhesive Layer Together The base material having the adhesive layer formed thereon was placed on a hot plate set to a predetermined temperature (in this example, 60° C.) that was equal to or higher than the melting point of the polymer solution obtained in the above synthesis example so that adhesiveness could be enhanced. In a state where the adhesive layer was heated through the base material, the PET film having the solder powder-containing adhesive layer formed thereon was placed thereon with the adhesive layer and the solder powder-containing adhesive layer being opposed to each other. In this way, the solder powder-containing adhesive layer and the adhesive layer were adhered together.

Then, the base material having the solder powder-containing adhesive layer and the adhesive layer adhered together was removed from the hot plate and cooled. After the cooling, the PET film was removed from the solder powder-containing adhesive layer. In this way, a sheet was obtained in which the solder powder-containing adhesive layer, in which two or more layers of the solder powder mixed with the adhesive component were stacked, was formed on the surface of the adhesive layer formed on the base material.

(1-d) Formation of Solder Powder Layer

The base material having the adhesive layer and the solder powder-containing adhesive layer formed thereon was placed on a hot plate set to a predetermined temperature (in this example, 80° C.) that was equal to or higher than the melting point of the polymer solution obtained in the above synthesis example so that adhesiveness could be enhanced.

In a state where the adhesive layer and the solder powder-containing adhesive layer were heated through the base material, solder powder was sprinkled onto the surface of the solder powder-containing adhesive layer and uniformly dispersed using an electrostatic brush and a puff so that the solder powder was adhered to the surface of the solder powder-containing adhesive layer and an excess of the powder was removed.

Then, the base material having the solder powder-containing adhesive layer to which the solder powder had been adhered was removed from the hot plate and cooled to form a solder transfer sheet of the executed example in which a solder powder layer having one or more layers of the solder powder was formed on the surface of the solder powder-containing adhesive layer formed on the base material through the adhesive layer.

Comparison Example (2-a) Formation of Adhesive Layer

A solvent (ethyl acetate) was added to the polymer solution obtained in the above synthesis example to adjust the solid content % to 25%. Then, CHEMITITE PZ-33 (manufactured by NIPPON SHOKUBAI CO., LTD.) was added as a cross-linking agent to this polymer solution in an amount of 0.2 parts per 100 parts of the polymer. The above solution was applied onto a corona-treated surface of a 100 μm-thick polyethylene terephthalate (PET) film with a comma coater to obtain a 40 μm-thick adhesive layer containing an acrylic adhesive component.

(2-b) Formation of Solder Powder Layer

The base material having the adhesive layer formed thereon was placed on a hot plate set to a predetermined temperature (in this example, 80° C.) that was equal to or higher than the melting point of the polymer solution obtained in the above synthesis example so that adhesiveness could be enhanced.

In a state where the adhesive layer was heated through the base material, solder powder was sprinkled onto the surface of the adhesive layer and uniformly dispersed using an electrostatic brush and a puff so that the solder powder was adhered to the surface of the adhesive layer and an excess of the powder was removed.

Then, the base material having the adhesive layer to which the solder powder had been adhered was removed from the hot plate and cooled to form a solder transfer sheet of the comparison example in which a solder powder layer having one layer of the solder powder was formed on the surface of the adhesive layer formed on the base material.

[Evaluation]

Solder bumps were formed in the following steps using NANOIMPRINTER manufactured by MEISHO KIKO CO., Ltd. (hereinafter, referred to as "experiment device") as transferring condition. First, a ceramic plate was placed on a lower heater stage of the experiment device. Then, a cushioning material was placed on the ceramic plate, the solder transfer sheet of the executed example or the comparison example was placed thereon, and finally, a 50 μm-pitch workpiece was placed. Then, the temperature of the lower heater stage was set to 40° C., the temperature of an upper heater stage of the experiment device was set to 201° C., and the lower heater stage was elevated to press the workpiece against the upper heater stage to apply pressure to the workpiece. When a pressing force reached a desired value of 0.4 kN/pcs, the temperature of the upper heater stage was increased to 225° C. while the temperature of the lower heater stage was maintained at 40° C. to apply heat and pressure for 1 sec. Then, the temperature of the upper heater stage was decreased to 100° C. Then, the lower heater stage descended to reduce pressure. Then, the workpiece was taken out of the experiment device to observe the solder bumps formed on the workpiece.

It is to be noted that the mechanism of diffusion bonding is considered as follows. The solder transfer sheet is also heated by the upper heater stage from the side of the electrode 60 of the substrate 6. However, it is heated gradually in the order of the solder powder layer 2, the solder powder-containing adhesive layer 3, and the adhesive layer 4, and therefore at the surfaces of the electrodes 60, the solder of the solder powder layer 2 is first diffusion-bonded to the electrodes. After or at the same time as this, the solder of the solder powder-containing adhesive layer 3 that is in contact with the solder of the solder powder layer 2 is diffusion-bonded. In the solder powder-containing adhesive layer 3, diffusion bonding areas are expanded from areas where diffusion bonding has occurred. Heat conduction from the upper heater stage to the solder of the solder powder layer 2 is poor in areas where the electrodes 60 are not provided on the substrate 6 so that, as shown in FIG. 3B, in areas where diffusion bonding has not occurred, the solder powder layer 2 and the solder powder-containing adhesive layer 3 are removed together with the adhesive layer 4.

The evaluation results are shown in Table 1.

TABLE 1

| | Adhesive Component | Solder Powder-Containing Adhesive Layer | Solder Height | Transferability (Bridge) |
|---|---|---|---|---|
| Executed Example | Side-Chain Crystalline Polymer | Present | ○ | ○ |
| Comparison Example | Side-Chain Crystalline Polymer | Absent | x | ○ |

In both of the executed example and the comparison example, transferability of the solder powder to the electrodes has been excellent. In the solder transfer sheet of the executed example in which two or more layers of the solder powder have been stacked, transfer defects have been not observed. Further, in neither executed example nor comparison example, bridging after reflowing has occurred.

On the shape of solder bumps after reflowing, that of the executed example shown in FIG. 5A is more spherical than that of the comparison example having one layer of the solder powder, shown in FIG. 5B. It is supposed that the solder volume of the solder bumps is larger in the executed example than that in the comparison example. From this, it has been found that the solder transfer sheet of the executed example is capable of increasing the amount of solder to be transferred without the occurrence of bridging while ensuring excellent transferability.

It is to be noted that as can be seen from the executed example, excellent removability of the solder powder-containing adhesive layer from the adhesive layer can be achieved without causing transfer defects by using a side-chain crystalline polymer as the adhesive component of the adhesive layer and the adhesive component of the solder powder-containing adhesive layer.

EXPLANATION OF CODES

1A: solder transfer sheet
2: solder powder layer
20: solder powder
3: solder powder-containing adhesive layer
30: solder powder
31: adhesive component
4: adhesive layer
41: adhesive component
5: base material

The invention claimed is:

1. A solder transfer sheet comprising:
   a base material;
   an adhesive layer formed on one surface of the base material;
   a solder powder-containing adhesive layer formed on one surface of the adhesive layer; and
   a solder powder layer formed on one surface of the solder powder-containing adhesive layer, wherein the solder powder layer contains solder powder arranged in a sheet form,
   wherein the solder powder-containing adhesive layer contains a mixture of solder powder and an adhesive component so as to have a thickness that a predetermined amount of solder is contained.

2. The solder transfer sheet according to claim 1, wherein the solder powder layer contains solder powder arranged in a one-layer sheet form.

3. The solder transfer sheet according to claim 1, wherein the adhesive component of the solder powder-containing adhesive layer comprises a compound that is not volatilized at a melting point of the solder powder.

4. The solder transfer sheet according to claim 1, wherein the adhesive component of the solder powder-containing adhesive layer contains a side-chain crystalline polymer, the adhesive component having flowability at a temperature equal to or higher than a melting point of the side-chain crystalline polymer to exhibit adhesive force and the adhesive component being crystallized at a temperature lower than the melting point of the side-chain crystalline polymer to reduce the adhesive force thereof.

5. The solder transfer sheet according to claim 4, wherein the side-chain crystalline polymer has a melting point of 30° C. or higher but lower than 70° C.

6. The solder transfer sheet according to claim 4, wherein the adhesive component has an adhesive force of less than 2.0 N/25 mm at a temperature of lower than the melting point of the side-chain crystalline polymer.

7. The solder transfer sheet according to claim 1, wherein a volume ratio between the solder powder and the adhesive component constituting the solder powder-containing adhesive layer is 74 to 26.

8. A method for solder precoating using a solder transfer sheet comprising:
   applying an adhesive onto a base material to form an adhesive layer;
   forming a solder powder-containing adhesive layer containing solder powder and an adhesive on the adhesive layer;
   sprinkling solder powder onto the solder powder-containing adhesive layer;
   removing an excess of the solder powder on the solder powder-containing adhesive layer to form a solder powder layer;
   laying the solder powder layer of a solder transfer sheet having the adhesive layer, the solder powder-containing adhesive layer, and the solder powder layer on top of an electrode side of a workpiece;
   applying heat and pressure at the same time on an object obtained by laying the solder transfer sheet on top of the workpiece; and
   removing the solder transfer sheet after solder solidification.

* * * * *